(12) United States Patent
Nishio (10) Patent No.: US 8,452,136 B2
(45) Date of Patent: May 28, 2013

(54) SUSPENSION BOARD WITH CIRCUIT AND PRODUCING METHOD THEREOF

(75) Inventor: Hajime Nishio, Osaka (JP)

(73) Assignee: Nitto Denko Corporation, Osaka (JP)

( * ) Notice: Subject to any disclaimer, the term of this patent is extended or adjusted under 35 U.S.C. 154(b) by 167 days.

(21) Appl. No.: 12/923,731

(22) Filed: Oct. 6, 2010

(65) Prior Publication Data

US 2011/0091152 A1    Apr. 21, 2011

Related U.S. Application Data

(60) Provisional application No. 61/282,028, filed on Dec. 4, 2009.

(30) Foreign Application Priority Data

Oct. 16, 2009    (JP) ................................. 2009-239456

(51) Int. Cl.
    *G02B 6/12*    (2006.01)

(52) U.S. Cl.
    USPC .............. 385/14; 385/88; 427/487; 427/96.1

(58) Field of Classification Search
    USPC . 385/14, 88, 89; 360/246, 125, 294; 427/487, 427/96.1; 324/699
    See application file for complete search history.

(56) References Cited

U.S. PATENT DOCUMENTS

| 5,872,884 | A | 2/1999 | Mizuuchi et al. | |
| 7,033,457 | B2* | 4/2006 | Kim et al. | 156/257 |
| 7,440,236 | B1* | 10/2008 | Bennin et al. | 360/294.4 |
| 7,546,003 | B2* | 6/2009 | Juni et al. | 385/14 |
| 8,000,566 | B2* | 8/2011 | Naito et al. | 385/14 |
| 2001/0055453 | A1 | 12/2001 | Mizuuchi et al. | |
| 2003/0059151 | A1 | 3/2003 | Brist et al. | |
| 2006/0187564 | A1 | 8/2006 | Sato et al. | |
| 2007/0177302 | A1* | 8/2007 | Shimazawa et al. | 360/126 |
| 2007/0242921 | A1* | 10/2007 | Matsumoto | 385/33 |
| 2008/0115962 | A1 | 5/2008 | Juni et al. | |
| 2008/0130155 | A1 | 6/2008 | Naniwa et al. | |
| 2008/0151431 | A1 | 6/2008 | Tanaka et al. | |
| 2008/0205202 | A1* | 8/2008 | Komura et al. | 369/13.02 |
| 2008/0305439 | A1 | 12/2008 | Khan | |
| 2009/0022466 | A1 | 1/2009 | Khan | |
| 2009/0032299 | A1 | 2/2009 | Khan | |
| 2010/0007980 | A1 | 1/2010 | Kim et al. | |
| 2010/0176827 | A1* | 7/2010 | Yamazaki et al. | 324/699 |
| 2010/0188779 | A1* | 7/2010 | Ohsawa et al. | 360/246.1 |

FOREIGN PATENT DOCUMENTS

| JP | 58-081719 A | 5/1983 |
| JP | 09-281536 A | 10/1997 |
| JP | 2002-250949 | 9/2002 |
| JP | 2004-035838 | 2/2004 |
| JP | 2006-185548 | 7/2006 |

(Continued)

*Primary Examiner* — Ellen Kim (74) *Attorney, Agent, or Firm* — Jean C. Edwards, Esq.; Edwards Neils PLLC (57) ABSTRACT

A suspension board with circuit includes a circuit board including a metal supporting board, an insulating layer formed on the metal supporting board, and a conductive layer formed on the insulating layer; and an optical waveguide provided in the circuit board. The optical waveguide is provided with a positioning portion for positioning the optical waveguide and a near-field light generation portion for generating a near-field light by a light applied from the optical waveguide.

15 Claims, 9 Drawing Sheets

FOREIGN PATENT DOCUMENTS

| | | |
|---|---|---|
| JP | 2007-052918 | 3/2007 |
| JP | 2007-207349 | 8/2007 |
| JP | 2007-280572 | 10/2007 |
| JP | 2007-334128 A | 12/2007 |
| JP | 2008-130106 | 6/2008 |
| JP | 2008-152899 A | 7/2008 |
| JP | 2009-015307 A | 1/2009 |
| JP | 2009-025385 A | 2/2009 |
| JP | 2009-176354 A | 8/2009 |
| JP | 2009-231575 A | 10/2009 |
| WO | WO 2007/133036 A1 | 11/2007 |

* cited by examiner

SUSPENSION BOARD WITH CIRCUIT AND PRODUCING METHOD THEREOF

CROSS-REFERENCE TO RELATED APPLICATION

The present application claims the benefit of U.S. Provisional Application No. 61/282,028 filed on Dec. 4, 2009, and claims priority from Japanese Patent Application No. 2009-239456 filed on Oct. 16, 2009, the contents of which are herein incorporated by reference into this application.

BACKGROUND OF THE INVENTION

1. Field of the Invention

The present invention relates to a suspension board with circuit and a producing method thereof. More particularly, the present invention relates to a suspension board with circuit mounted on a hard disk drive which adopts an optical assist system, and a producing method thereof.

2. Description of Related Art

Conventionally, an optical assist system (optical assist magnetic recording system) has been known as a magnetic recording system for a hard disk drive or the like that is capable of recording information at high density in a small recording magnetic field by heating a hard disk drive under near-field light application during recording of information, and then recording the information with a magnetic head in a state where the coercive force of the hard disk is reduced.

There has been proposed that, for example, in the optical assist magnetic recording apparatus which adopts an optical assist system, a heat assisted magnetic recording head provided with a suspension and an optical waveguide (a second optical waveguide) formed thereon is supported by a floating slider (cf. Japanese Unexamined Patent Publication No. 2006-185548).

An optical waveguide (a first optical waveguide) different from the second optical waveguide and a near-field light generation portion arranged on the underside thereof are provided in the floating slider, and the end portion of the second optical waveguide is arranged in opposed relation to the upper end portion of the first optical waveguide, so that a light transmitted through the second optical waveguide passes through the first optical waveguide, and finally applies a near-field light generation portion, thereby heating a hard disk.

SUMMARY OF THE INVENTION

However, in the heat assisted magnetic recording head described in Japanese Unexamined Patent Publication No. 2006-185548, when the second optical waveguide and the first optical waveguide cannot be arranged accurately, the light is insufficiently applied from the second optical waveguide to the near-field light generation portion through the first optical waveguide. This causes insufficient heating of the hard disk by the near-field light generation portion, so that information cannot be recorded onto the hard disk at high density.

It is an object of the present invention to provide a suspension board with circuit capable of reliably applying a light transmitted through an optical waveguide to a near-field light generation portion by accurately positioning the optical waveguide and the near-field light generation portion, and a producing method thereof.

The suspension board with circuit of the present invention includes a circuit board including a metal supporting board, an insulating layer formed on the metal supporting board, and a conductive layer formed on the insulating layer; and an optical waveguide provided in the circuit board, and the optical waveguide is provided with a positioning portion for positioning the optical waveguide and a near-field light generation portion for generating a near-field light by a light applied from the optical waveguide.

According to the suspension board with circuit, the positioning portion allows the optical waveguide and the near-field light generation portion to be accurately positioned. Therefore, the light transmitted through the optical waveguide can be reliably applied to the near-field light generation portion, so that the hard disk can be sufficiently heated.

As a result, information can be recorded on the hard disk at high density, thereby allowing to reliably perform an optical assist system.

In the suspension board with circuit of the present invention, it is preferable that the optical waveguide includes an under clad layer, a core layer formed on the under clad layer, and an over clad layer formed on the core layer and contained in the core layer when projected in a thickness direction of the core layer.

In the suspension board with circuit, in the core layer, when a portion facing the underside of the over clad layer is applied with light, a path capable of transmitting the light is formed along the over clad layer. The over clad layer can be easily visually identified in the thickness direction.

Therefore, the relative position of the path to the positioning portion can be easily recognized. As a result, the path and the near-field light generation portion can be accurately positioned.

In the suspension board with circuit of the present invention, it is preferable that the positioning portion is arranged in spaced relation to the over clad layer.

In the suspension board with circuit, since the positioning portion is spaced apart from the over clad layer, a deviation of the relative position of the path to the positioning portion can be easily recognized.

Therefore, the path and the near-field light generation portion can be even further accurately positioned.

In the suspension board with circuit of the present invention, it is preferable that the over clad layer extends in a lengthwise direction and has a width in a direction perpendicular to the lengthwise direction of 10 μm or less.

In the suspension board with circuit, the width of the over clad layer is within a specified range, so that the path can be configured in a single mode distribution. Therefore, the light transmitted through the optical waveguide is reliably and efficiently applied as a single-mode light to the near-field light generation portion, allowing the hard disk to be heated reliably and efficiently.

As a result, the optical assist system can be reliably and efficiently performed.

In the suspension board with circuit of the present invention, it is preferable that the near-field light generation portion is provided in the head slider where a magnetic head is mounted.

In this suspension board with circuit, the head slider mounts the near-field light generation portion and the magnetic head. Therefore, the optical assist system can be reliably performed.

The method for producing a suspension board with circuit includes: a circuit board including a metal supporting board, an insulating layer formed on the metal supporting board, and a conductive layer formed on the insulating layer; and an optical waveguide provided in the circuit board, the optical waveguide being provided with a positioning portion for positioning the optical waveguide and a near-field light generation portion for generating a near-field light by a light applied from the optical waveguide, wherein the optical waveguide and the near-field light generation portion are positioned by using the positioning portion.

According to this method, since the optical waveguide and the near-field light generation portion can be accurately positioned by the positioning portion, the light transmitted through the optical waveguide can be reliably applied to the near-field light generation portion, so that a hard disk can be sufficiently heated.

As a result, information can be recorded on the hard disk at high density, thereby allowing to reliably perform an optical assist system.

The method for producing the suspension board with circuit of the present invention includes the steps of preparing a circuit board including a metal supporting board, an insulating layer formed on the metal supporting board, and a conductive layer formed on the insulating layer; and providing an optical waveguide in the circuit board, the optical waveguide including an under clad layer, a core layer formed on the under clad layer, an over clad layer formed on the core layer and contained in the core layer when projected in the thickness direction of the core layer, and a positioning portion arranged in spaced relation to the over clad layer, for positioning relative to a near-field light generation portion for generating a near-field light by an applied light, in which the step of providing the optical waveguide in the circuit board includes the steps of forming a photosensitive coating on the core layer, and simultaneously forming the over clad layer and the positioning portion by exposing the coating to light via one sheet of photomask and then developing the coating.

According to this method, the over clad layer and the positioning portion can be formed by exposure to light via one sheet of photomask, allowing them to be accurately relatively positioned.

Therefore, the path and the near-field light generation portion can be even further accurately positioned.

DETAILED DESCRIPTION OF PREFERRED EMBODIMENTS

Figure 1:
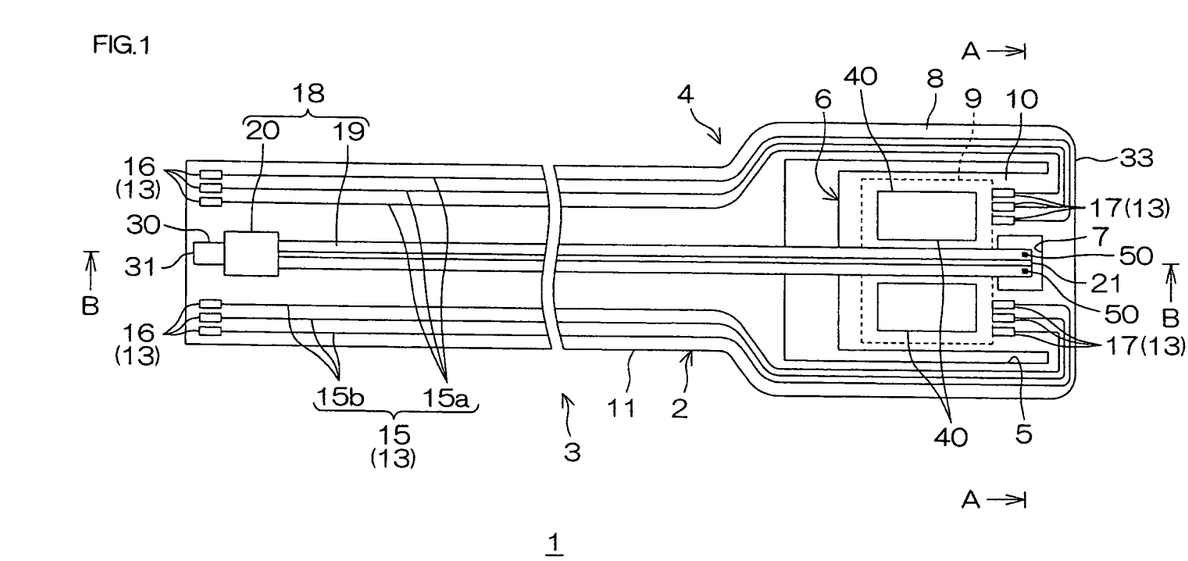
FIG. 1 is a plan view illustrating a suspension board with circuit of an embodiment according to the present invention.
Figure 2:
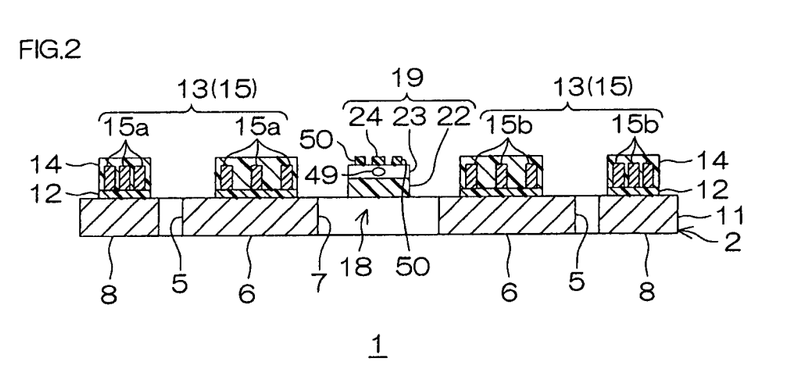
FIG. 2 is a sectional view, taken along the line A-A in FIG. 1, illustrating the suspension board with circuit shown in FIG. 1 taken along a widthwise direction.
Figure 3:
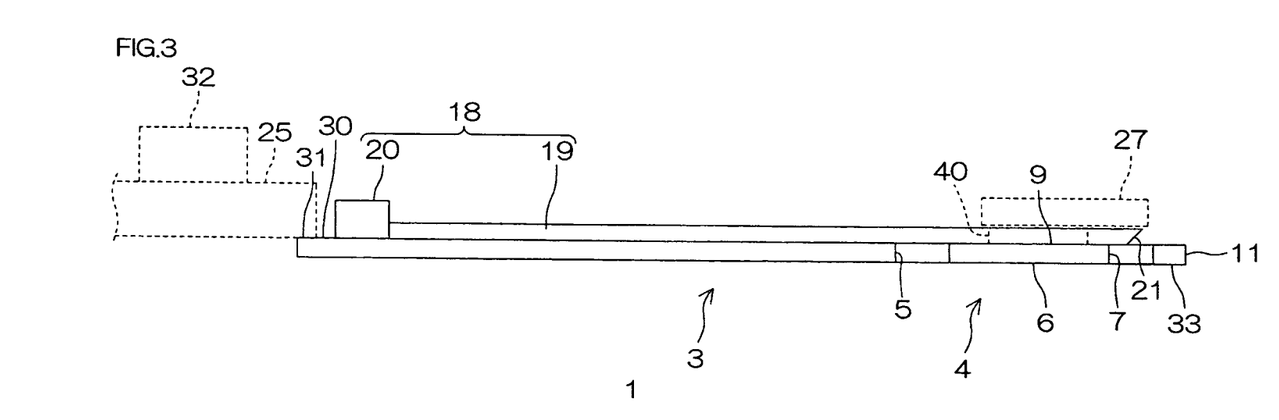
FIG. 3 is a sectional view, taken along the line B-B in FIG. 1, illustrating the suspension board with circuit shown in FIG. 1 taken along a lengthwise direction.
Figure 4:
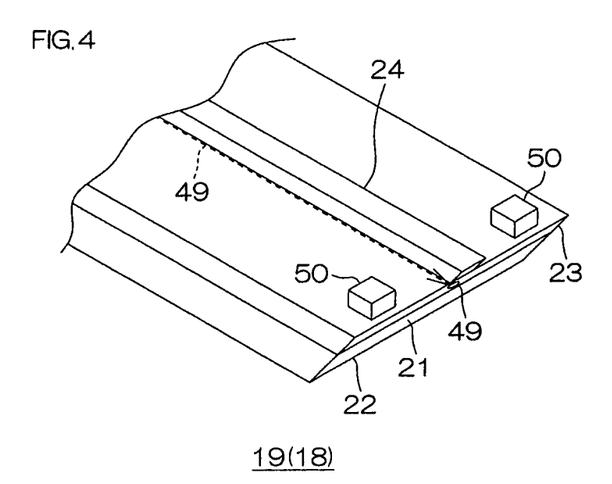
FIG. 4 is an enlarged perspective view of the front end portion of an optical waveguide in the suspension board with circuit shown in FIG. 1.
Figure 5:
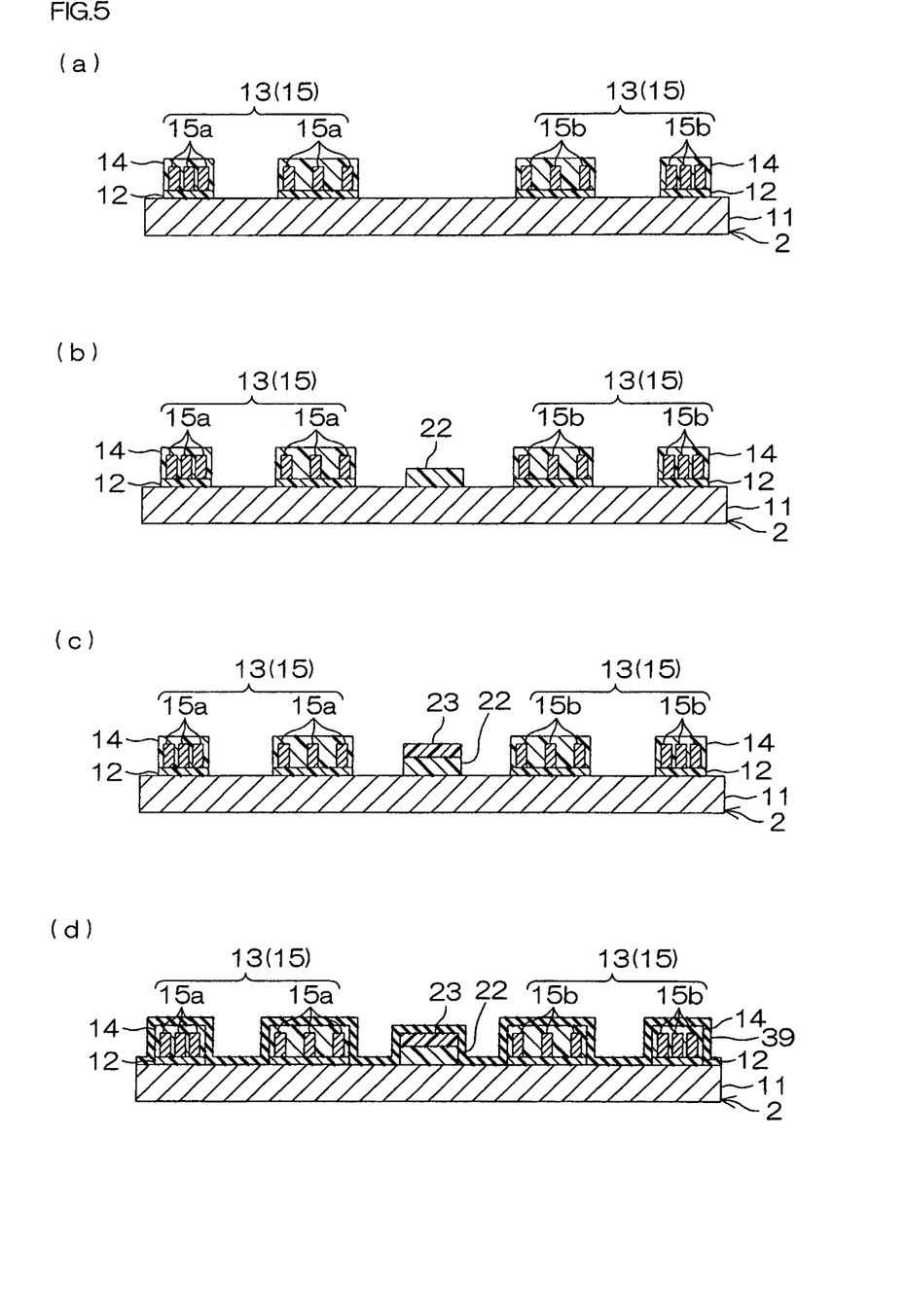
FIG. 5 is a sectional view illustrating the steps of producing a suspension board with circuit shown in FIG. 2,
  (a) showing the step of preparing a circuit board,
  (b) showing the step of forming an under clad layer,
  (c) showing the step of forming a core layer, and
  (d) showing the step of forming a photosensitive coating.
Figure 6:
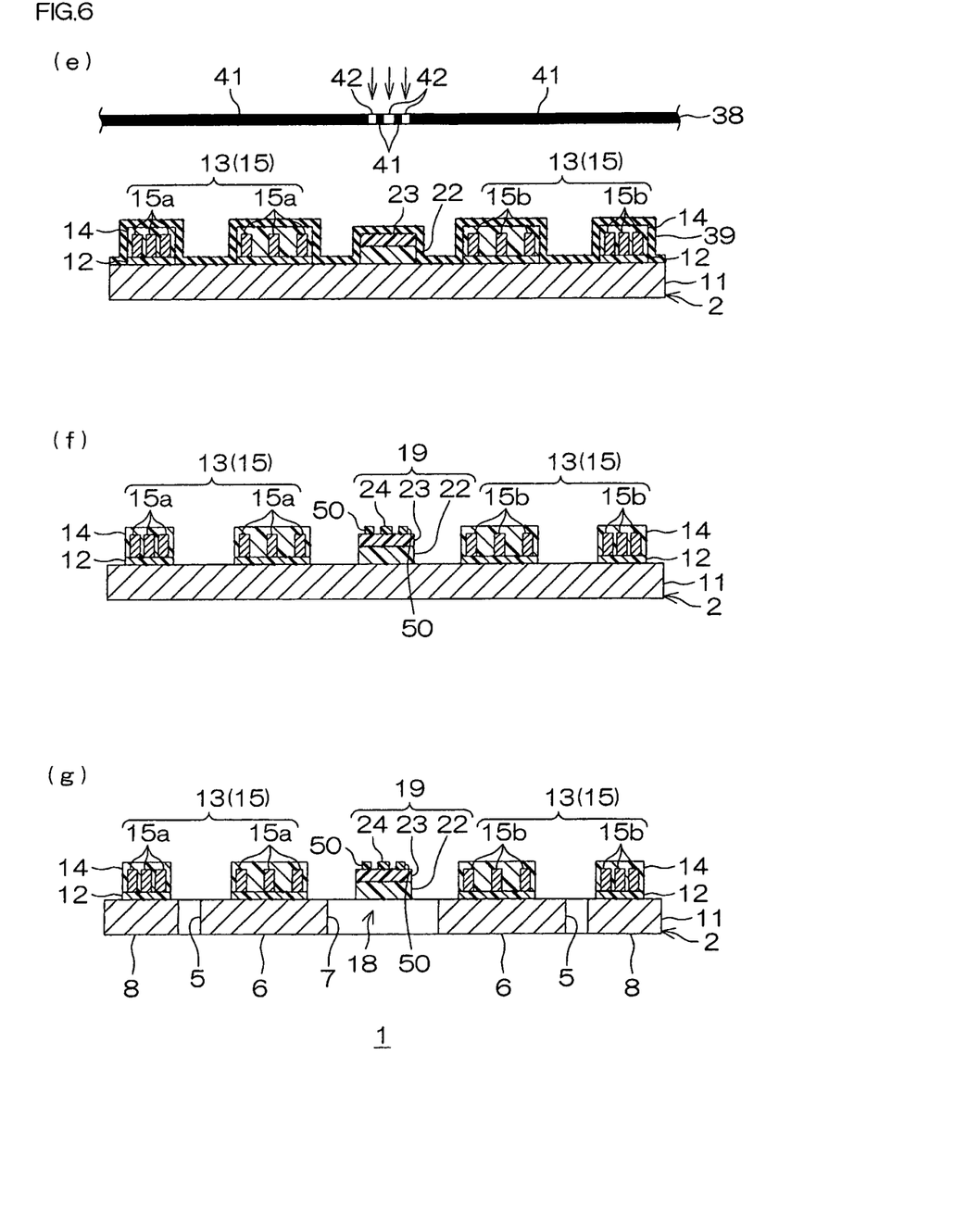
FIG. 6 is a sectional view illustrating the steps of producing the suspension board with circuit shown in FIG. 2, subsequent to FIG. 5,
  (e) showing the step of exposing the coating to light via a photomask,
  (f) showing the step of developing the coating to form an over clad layer, and
  (g) showing the step of forming an opening and a slit.
Figure 7:
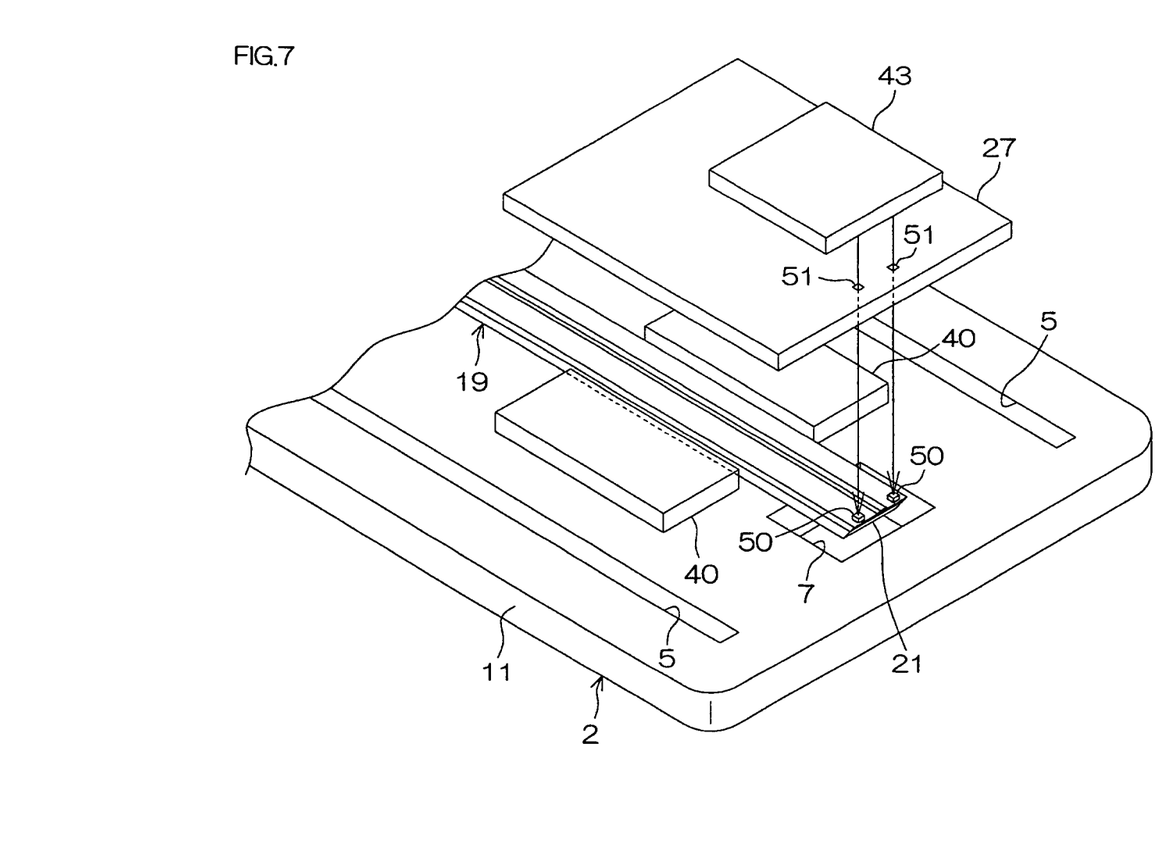
FIG. 7 is a perspective view illustrating positioning of a head slider relative to the optical waveguide.
Figure 8:
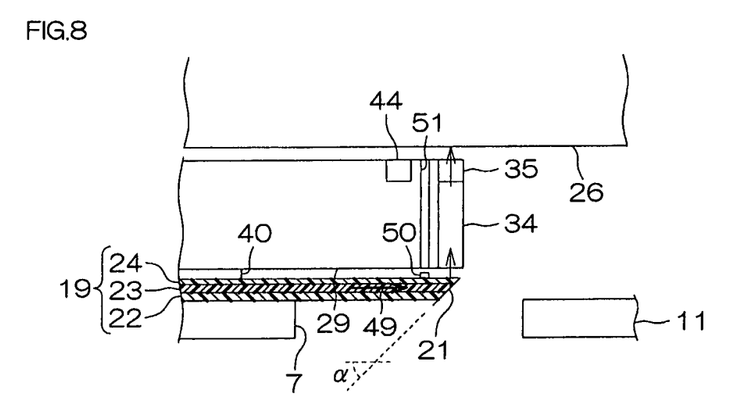
FIG. 8 is a sectional view of the suspension board with circuit where the head slider has been positioned.

FIG. 1 is a plan view illustrating a suspension board with circuit of an embodiment according to the present invention; FIG. 2 is a sectional view, taken along the line A-A in FIG. 1, illustrating the suspension board with circuit shown in FIG. 1 taken along a widthwise direction (a direction perpendicular to a lengthwise direction); FIG. 3 is a sectional view, taken along the line B-B in FIG. 1, illustrating the suspension board with circuit shown in FIG. 1 taken along a lengthwise direction; FIG. 4 is an enlarged perspective view of the front end portion of an optical waveguide in the suspension board with circuit shown in FIG. 1; FIGS. 5 and 6 are sectional views illustrating the steps of producing a suspension board with circuit shown in FIG. 2, FIG. 7 is a perspective view illustrating positioning of a head slider relative to the suspension board with circuit; and FIG. 8 is a sectional view of the suspension board with circuit where the head slider has been positioned.

To clarify a relative position of a conductive pattern 13 and an optical waveguide 19, which are mentioned later, an insulating base layer 12 and an insulating cover layer 14, which are mentioned later, are omitted in FIGS. 1 and 3. In addition, to clarify a relative position of the optical waveguide 19, the conductive pattern 13 is omitted in FIG. 7.

In FIG. 1, the suspension board with circuit 1 includes a circuit board 2 and an optical assist portion 18 provided on the circuit board 2.

The circuit board 2 includes a metal supporting board 11 mounted on a hard disk drive. A conductive pattern 13 for connecting a magnetic head 44 (cf. FIG. 8) and an external circuit board (e.g., a read/write board, etc.; cf. dashed lines in FIG. 3) 25 is integrally formed on the metal supporting board 11. The metal supporting board 11 supports the magnetic head 44 mounted thereon, while holding a minute gap between the magnetic head 44 and a hard disk 26 (cf. FIG. 8) against an airflow caused when the magnetic head 44 and the hard disk 26 travel relatively to each other.

The circuit board 2 is formed so as to correspond to the external shape of the suspension board with circuit 1, and has a shape of a flat band extending in the lengthwise direction, integrally including a wire portion 3 arranged on one side in the lengthwise direction (hereinafter referred to as the rear side), and a gimbal portion 4 arranged on the other side in the lengthwise direction (hereinafter referred to as the front side) of the wire portion 3.

The wire portion 3 is formed in a generally rectangular shape in plane view extending in the lengthwise direction.

The gimbal portion 4 is continuously formed from the front end of the wire portion 3, while having a generally rectangular shape in plane view expanding toward both widthwise outer sides of the wire portion 3. The gimbal portion 4 is also formed with a slit 5 having a generally U-shape opening toward the front side in plane view. Further, the gimbal portion 4 integrally includes a tongue portion 6 sandwiched by the slit 5 in the widthwise direction, and an outrigger portion 8 arranged on both the widthwise outer sides of the slit 5, and a wire folding portion 33 arranged on the front sides of the tongue portion 6 and the outrigger portion 8.

The tongue portion 6 is formed in a generally rectangular shape in plane view, and includes a mounting portion 9 and a terminal forming portion 10.

The mounting portion 9 is a region (a dashed-line region in FIG. 1) for mounting a head slider 27, arranged on the rear side and the center of the tongue portion 6 in the lengthwise direction in plane view, and formed in a generally rectangular shape in plane view. Further, the mounting portion 9 includes a pedestal 40.

The pedestal 40 is provided for supporting the head slider 27 (cf. FIG. 8), and a plurality (two pieces) of the pedestals 40 are arranged almost over the lengthwise direction of the mounting portion 9 in spaced relation where an optical waveguide 19 to be described later can be provided in the widthwise direction. Each of the pedestals 40 is formed in a generally rectangular shape in plane view extending in the lengthwise direction.

The terminal forming portion 10 is a region in which a head-side terminal 17 to be described later is formed and having a generally rectangular shape in plane view extending in the widthwise direction, and is arranged on the front side of the mounting portion 9. Further, the terminal forming portion 10 has an opening 7 formed therein.

The opening 7 has a generally rectangular shape in plane view extending through the metal supporting board 11 in the thickness direction, and is formed at the widthwise center of the terminal forming portion 10.

The conductive pattern 13 includes an external terminal 16, a head-side terminal 17, and a signal wire 15 for connecting the external terminal 16 and the head-side terminal 17, which are formed integrally and continuously.

A plurality (six pieces) of the signal wires 15 are provided along the lengthwise direction of the circuit board 2, each signal wire 15 arranged in parallel at spaced intervals to each other in the widthwise direction.

The plurality of the signal wires 15 include three first wires 15a arranged on one side in the widthwise direction, and three second wires 15b arranged on the other side in the widthwise direction. The signal wires 15 are arranged in the following manner. In the wiring portion 3, the signal wires 15 extend along the lengthwise direction, and in the gimbal portion 4, extend along the outrigger portion 8. After reaching the wire folding portion 33, the signal wires 15 extend inward in the widthwise direction, yet turn back toward the rear side to finally reach the front end portion of the head-side terminal 17 in the terminal forming portion 10.

A plurality (six pieces) of the external terminals 16 are arranged in the rear end portion of the wire portion 3, and are provided so as to each be connected with the rear end portion of each of the wires 15. Further, the external terminals 16 are arranged at spaced intervals to each other in the widthwise direction. A terminal of the external circuit board 25 (indicated by dashed lines in FIG. 3) is connected to the external terminals 16.

The head-side terminal 17 is arranged in the gimbal portion 4, and more specifically, arranged in the terminal forming portion 10 in the tongue portion 6. A plurality (six pieces) of the head-side terminals 17 are provided so as to each be connected with the front end portion of each of the signal wires 15.

More specifically, the head-side terminals 17 are arranged along the rear end edge (the front edge of the mounting portion 9) of the terminal forming portion 10 at spaced intervals to each other in the widthwise direction. A terminal of the magnetic head 44 (FIG. 8) is connected to the head-side terminals 17.

As shown in FIG. 2, the circuit board 2 includes the metal supporting board 11, an insulating base layer 12 formed on the metal supporting board 11, the conductive pattern 13 formed on the insulating base layer 12, and an insulating cover layer 14 formed on the insulating base layer 12 so as to cover the conductive pattern 13.

As shown in FIGS. 1 to 3, the metal supporting board 11 is formed corresponding to the outer shape of the circuit board 2.

On the upper surface of the metal supporting board 11, the insulating base layer 12 is formed so as to correspond to a position where the conductive pattern 13 is formed in the wire portion 3 and the gimbal portion 4. Further, on the upper surface of the metal supporting board 11, the insulating base layer 12 is arranged so as to reserve a region for forming the optical waveguide 19 to be described later. In the wire portion 3, the insulating base layer 12 is also formed so as to correspond to a position where a supply wire 30 and a supply terminal 31 both described later are formed.

The conductive pattern 13 is arranged over the wire portion 3 and the gimbal portion 4 so as to be included in the insulating base layer 12 when projected in the thickness direction. Further, on the upper surface of the insulating base layer 12, the conductive pattern 13 is formed as a wired circuit pattern including the external terminals 16, the head-side terminals 17, and the signal wires 15, which are formed integrally and continuously.

The insulating cover layer 14 is arranged over the wire portion 3 and the gimbal portion 4, and on the upper surface of the insulating base layer 12, is arranged so as to correspond to a position where the signal wires 15 are formed. The insulating cover layer 14 is formed so as to expose the external terminals 16 and the head-side terminals 17, and to cover the signal wires 15.

The optical assist portion 18 includes an optical waveguide (a first optical waveguide) 19 and a light emitting device 20.

The optical waveguide 19 is provided in the circuit board 2 and is arranged over the wire portion 3 and the gimbal portion 4 in spaced relation to the signal wires 15. Specifically, on the upper surface of the metal supporting board 11, the optical waveguide 19 is arranged at the widthwise center position of the metal supporting board 11, and is formed in a linear shape in plane view along the lengthwise direction. Further, the optical waveguide 19 is arranged between the first wires 15a and the second wires 15b so as to extend in parallel to these wires.

The optical waveguide 19 is arranged so as to perpendicularly traverse the slit 5 from the front end portion of the wire portion 3, then pass through between the two pedestals 40, and finally let the end face 21 of the front end portion of the optical waveguide 19 face the opening 7.

The optical waveguide 19 has a strip-loaded structure, including an under clad layer 22, a core layer 23 formed on the under clad layer 22, and an over clad layer 24 formed on the core layer 23 so as to be included in the core layer 23 when projected in the thickness direction of the core layer 23, as shown in FIGS. 2 and 4.

On the upper surface of the metal supporting board 11, the under clad layer 22 is formed in a flat band shape extending in the lengthwise direction so as to correspond to the outer shape of the optical waveguide 19.

The core layer 23 is formed over the entire upper surface of the under clad layer 22 so that both widthwise end edges thereof are in the same positions in plane view as those of the under clad layer 22.

The over clad layer 24 extends along the lengthwise direction and on the upper surface of the core layer 23, is formed so as to have a narrower width than the core layer 23. More specifically, the over clad layer 24 is arranged at the widthwise center of the core layer 23 and is formed so as to expose both widthwise end portions of the core layer 23.

In the core layer 23, a path 49 is formed in a portion facing the underside of the over clad layer 24, and when light is applied to the portion, the path 49 transmits the light along the over clad layer 24.

As shown in FIGS. 4 and 8, the optical waveguide 19 is formed in a shape in which the front end portion thereof is beveled, specifically in which an end face 21 of the front end portion thereof intersects the lengthwise direction of the optical waveguide 19 at a given angle (tilt angle) α, for example. This forms the optical waveguide 19 so that the end face 21 thereof is a mirror surface having a tilt angle α. The light transmitted through the path of the optical waveguide 19 has its optical path deflected at a given angle by the end face 21, and the light thus deflected is applied upward, specifically, toward an entrance of the slider-side optical waveguide 34 to be described later. Such tilt angle α is not particularly limited, and is in the range of, for example, 35 to 55°, or preferably 40 to 50°, or more specifically 45°.

As shown in FIGS. 1 and 7, a portion which faces the opening 7 (a portion including the end face 21) of the optical waveguide 19 is exposed from the opening 7 of the metal supporting board 11.

A positioning mark 50 is provided on the optical waveguide 19, indicating a positioning portion.

As shown in FIGS. 1, 2, and 4, the positioning mark 50 is a reference mark for positioning the end face 21 of the front end portion of the optical waveguide 19 and the entrance of the slider-side optical waveguide (the second optical waveguide) 34, and a plurality (two pieces) of the positioning marks 50 are provided on both widthwise outer sides of the over clad layer 24 in the front end portion of the optical waveguide 19.

Each of the positioning marks 50 is formed as the same layer as the above-mentioned over clad layer 24, that is, formed on the upper surface of the core layer 23. The positioning marks 50 are formed each in a generally rectangular shape in plane view and are arranged in spaced relation on both widthwise outer sides of the over clad layer 24.

As shown in FIGS. 1 and 3, the light emitting device 20 is a light source for allowing light to be applied to the optical waveguide 19, and for example, converts electric energy into light energy to thereby apply high-energy light to the optical waveguide 19. The light emitting device 20 is arranged on the rear end portion of the circuit board 2, and more specifically, arranged at the widthwise center of the rear end portion of the wire portion 3 and spaced apart from the first wires 15a and the second wires 15b between these wires. The light emitting device 20 is connected with the rear end portion of the optical waveguide 19 so as to enter light into the path 49 of the core layer 23 of the optical waveguide 19.

A supply wire 30 for supplying electric energy to the light emitting device 20 is connected to the light emitting device 20, and a supply terminal 31 for being connected to a terminal of the external circuit board 25 (dashed lines in FIG. 3) is formed in the rear end portion of the supply wire 30. Both the supply wire 30 and the supply terminal 31 are formed on the insulating base layer 12, the supply wire 30 is covered with the insulating cover layer 14 and the supply terminal 31 is exposed from the insulating cover layer 14.

In the optical assist portion 18, the electric energy supplied through the supply terminal 31 and the supply wire 30 from the external circuit board 25 is converted into light energy in the light emitting device 20, and the resulting light is applied to the optical waveguide 19. The applied light is transmitted through the optical waveguide 19 and is reflected by the end face 21 of the front end portion of the optical waveguide 19, to be finally applied to the slider-side optical waveguide 34 (cf. FIG. 8) of the head slider 27.

Next, a method for producing the suspension board with circuit 1 is described with reference to FIGS. 5 and 6.

First, in this method, as shown in FIG. 5(a), a circuit board 2 in which an insulating base layer 12, a conductive pattern 13, and an insulating cover layer 14 are sequentially laminated on a metal supporting board 11 is prepared.

In order to prepare the circuit board 2, the metal supporting board 11 is first prepared.

The metal supporting board 11 is formed of metal material, such as stainless steel, 42-alloy, aluminum, copper-beryllium, or phosphor bronze. The metal supporting board 11 has a thickness in the range of, for example, 15 to 30 μm, or preferably 20 to 25 μm.

Then, the insulating base layer 12 is formed on the metal supporting board 11.

As an insulating material for forming the insulating base layer 12, for example, synthetic resin such as polyimide resin, polyamide imide resin, acrylic resin, polyether nitrile resin, polyether sulfone resin, polyethylene terephthalate resin, polyethylene naphthalate resin, and polyvinyl chloride resin is used. Of these, polyimide resin is preferably used.

To form the insulating base layer 12, for example, a varnish of the insulating material described above having photosensitivity is applied to the upper surface of the metal supporting board 11 and is then dried. Thereafter, the dried varnish is exposed to light via a photomask, and is then developed to be cured as required.

The insulating base layer 12 thus formed has a thickness in the range of, for example, 1 to 35 μm, or preferably 8 to 15 μm.

Subsequently, the conductive pattern 13 is formed on the insulating base layer 12.

As a conductive material for forming the conductive pattern 13, for example, copper, nickel, gold, solder, or alloys thereof is used.

To form the conductive pattern 13, a known patterning method such as an additive method or a subtractive method is used.

The conductive pattern 13 thus formed has a thickness in the range of, for example, 3 to 50 μm, or preferably 5 to 20 μm. Each of signal wires 15 has a width in the range of, for example, 10 to 200 μm, or preferably 20 to 100 μm, and a spacing between each of the signal wires 15 is in the range of, for example, 10 to 1000 μm, or preferably 20 to 100 μm. External terminals 16 and head-side terminals 17 each have a width in the range of, for example, 20 to 1000 μm, or preferably 30 to 800 μm, and a spacing between each of the external terminals 16 and a spacing between each of the head-side terminals 17 are in the range of, for example, 20 to 1000 μm, or preferably 30 to 800 μm.

The insulating cover layer 14 is formed of the same insulating material as of the above-mentioned insulating base layer 12.

To form the insulating cover layer 14, for example, a varnish of the insulating material described above having photosensitivity is applied to the upper surface of the metal supporting board 11 including the conductive pattern 13 and the insulating base layer 12, and is then dried. Thereafter, the dried varnish is exposed to light via a photomask, and is then developed to be cured as required.

The insulating cover layer 14 thus formed has a thickness in the range of, for example, 1 to 40 μm, or preferably 1 to 7 μm.

Therefore, the circuit board 2 in which the insulating base layer 12, the conductive pattern 13, and the insulating cover layer 14 are sequentially laminated on the metal supporting board 11 is prepared.

A supply wire 30 and a supply terminal 31 are formed in the same manner as above simultaneously with the formation of the above-mentioned conductive pattern 13.

Next, in this method, as shown in FIGS. 5(b) to 5(d), 6(e), and 6(f), an optical waveguide 19 is provided in the circuit board 2.

Specifically, an under clad layer 22, a core layer 23, and an over clad layer 24 are sequentially laminated on the insulating base layer 12.

To sequentially laminate the under clad layer 22, the core layer 23, and the over clad layer 24, the under clad layer 22 is first formed on the upper surface of the metal supporting board 11 as shown in FIG. 5(b).

As a material for forming the under clad layer 22, for example, a resin material such as polyimide resin, polyamide resin, silicone resin, epoxy resin (alicyclic epoxy resin, etc.), acrylic resin, fluorene derivative resin, a mixed resin of fluorene derivative resin and alicyclic epoxy resin, and a mixed resin of any of these resins and an alicyclic ether compound (e.g., an oxetane compound, etc.) is used. Of these, polyimide resin is preferably used in terms of heat resistance, epoxy resin is preferably used in terms of resolution, and acrylic resin is preferably used in terms of alkaline development. Preferably, these resin materials are used in the form of photosensitive resins containing a photosensitizer. Preferably, a mixed resin of a photosensitive fluorene derivative resin (a photosensitive fluorene epoxy resin as raw material) and an alicyclic epoxy resin is used. As the photosensitizer, for example, a known onium salt or the like is used.

To form the under clad layer 22 in the above-mentioned pattern, for example, a varnish (resin solution) of any of the above-mentioned photosensitive resins is prepared using a known diluent, the varnish thus prepared is applied to the entire upper surface of the metal supporting board 11 including the insulating cover layer 14 and the insulating base layer 12. Thereafter, the applied varnish is dried to form a photosensitive coating. Thereafter, the coating is exposed to light via a photomask and is then developed by dissolving an unexposed portion with a known organic solvent or the like. Thereafter, the developed varnish is cured as required.

The under clad layer 22 thus formed has a refractive index in the range of, for example, 1.45 or more and less than 1.54. The under clad layer 22 has a thickness in the range of, for example, 1 to 50 μm, or preferably 1 to 25 μm, and a width in the range of, for example, 20 to 200 μm, or preferably 30 to 100 μm.

Subsequently, as shown in FIG. 5(c), the core layer 23 is formed on the upper surface of the under clad layer 22.

As a material for forming the core layer 23, a resin material having a higher refractive index than that of the under clad layer 22 is used. The resin material that may be used includes, for example, the same resin as those mentioned above. Preferably, a mixed resin of a photosensitive fluorene derivative resin (a photosensitive fluorene epoxy resin as raw material) and an oxetane compound is used. In the resin material of the core layer 23, in order to make the refractive index of the core layer 23 higher than that of the under clad layer 22, an aromatic group such as a phenyl group can be introduced or a linear aliphatic group such as a methyl group and an ethyl group, and/or a cyclic aliphatic group such as a norbornene group can also be introduced.

To form the core layer 23 in the above-mentioned pattern, for example, a varnish (resin solution) of any of the above-mentioned photosensitive resins is prepared using a known diluent, the varnish thus prepared is applied to the upper surface of the metal supporting board 11 including the under clad layer 22. Thereafter, the applied varnish is dried to form a photosensitive coating. Thereafter, the coating is exposed to light via a photomask, and is then developed by dissolving an unexposed portion with a known organic solvent or the like. Thereafter, the developed varnish is cured as required.

The refractive index of the core layer 23 thus formed is set higher than that of the under clad layer 22, and specifically, the refractive index of the core layer 23 is set, for example, 0.001 to 0.01 higher than that of the under clad layer 22 from the viewpoint of configuring the path 49 of the core layer 23 in a single mode distribution. The core layer 23 has a refractive index in the range of, for example, 1.54 or more and 1.65 or less. The core layer 23 has a thickness in the range of, for example, 1 to 20 μm, or preferably 1 to 10 μm.

Next, as shown in FIGS. 5(d), 6(e), and 6(f), the over clad layer 24 is formed on the upper surface of the core layer 23 so as to be included in the core layer 23 when projected in the thickness direction. At the same time as this, the positioning marks 50 are formed on the upper surface of the core layer 23 in the above-mentioned pattern.

As a material for forming the over clad layer 24 and the positioning marks 50, the same resin material as that for the under clad layer 22 described above is used.

To form the over clad layer 24 and the positioning marks 50 in the above-mentioned pattern, first, for example, as shown in FIG. 5(d), a varnish (resin solution) of any of the above-mentioned resins is prepared using a known diluent, the varnish thus prepared is applied to the upper surface of the metal supporting board 11 including the core layer 23. Thereafter, the applied varnish is dried to form a photosensitive coating 39 on the core layer 23, on the insulating cover layer 14, and the metal supporting board 11 exposed from the core layer 23 and the insulating cover layer 14.

Then, as shown in FIG. 6(e), the coating 39 is exposed to light via a photomask 38.

The photomask 38 includes a mask pattern made of a light-shielded portion 41 and a light-transmitted portion 42. The photomask 38 is then arranged on the upper side of the coating 39, the light-transmitted portion 42 is opposed to a portion where the over clad layer 24 and the positioning marks 50 are formed, and the light-shielded portion 41 is opposed to the other portion. Subsequently, the coating 39 is exposed to light from above via the photomask 38.

Thereafter, as shown in FIG. 6(f), the portion opposed to the light-shielded portion 41, that is, an unexposed portion is dissolved using a known organic solvent or an alkaline aqueous solution to thereby develop the coating 39, and thereafter is cured as required.

Thus, the over clad layer 24 and the positioning marks 50 are simultaneously formed in the above-mentioned pattern.

The refractive index of the over clad layer 24 thus formed is set lower than that of the core layer 23, and is set to, for example, the same refractive index as that of the under clad layer 22.

The over clad layer 24 and the positioning marks 50 each have a thickness in the range of, for example, 1 to 20 μm, or preferably 1 to 10 μm.

The over clad layer 24 has a width in the range of, for example, 10 μm or less, or preferably 7 μm or less, and usually, for example, 1 μm or more, or preferably 3 μm or more.

When the width of the over clad layer 24 is within the above-mentioned range, the path 49 can be configured in a single mode distribution.

The positioning mark 50 has a width and a length (length in lengthwise direction) of, for example, 10 to 100 μm, or preferably 20 to 40 μm.

Thus, the optical waveguide 19 provided with the positioning marks 50 is provided on the metal supporting board 11.

Next, in this method, as shown in FIG. 6(g), an opening 7 is formed in the metal supporting board 11 in a terminal forming portion 10.

The opening 7 is formed by, for example, boring such as drilling, or for example, etching such as dry etching and wet etching, or preferably by etching.

The opening 7 is formed so as to overlap with the front end portion of the optical waveguide 19 in the thickness direction.

The opening 7 thus formed has a width and a length of, for example, 50 to 500 μm, or preferably 100 to 200 μm.

A slit 5 is formed simultaneously with the formation of the opening 7.

Subsequently, in this method, as shown in FIG. 8, the front end portion of the optical waveguide 19 is cut from the opening 7 side by laser processing in such a beveled manner that an end face 21 of the front end portion of the optical waveguide 19 intersects the lengthwise direction.

In the laser processing, a laser light which passes through the opening 7 is applied to the optical waveguide 19 from obliquely rear lower side so as to intersect the lengthwise direction at a given angle, to thereby cut the optical waveguide 19 at once.

Thereafter, on the rear end portion of the wire portion 3, a light emitting device 20 is disposed on the upper surface of the metal supporting board 11 so as to be optically connected with the rear end portion of the optical waveguide 19 and be electrically connected with the front end portion of the supply wire 30. Thus, the suspension board with circuit 1 is obtained.

In the suspension board with circuit 1 thus obtained, as indicated by dashed lines in FIG. 3, in the wire portion 3, the external terminal 16 (FIG. 1) and the supply terminal 31 are connected with a terminal of an external circuit board 25. A magnetic head 44 (FIG. 8) and an IC 32 for controlling a light emitting device 20 are mounted on the external circuit board 25, and the IC 32 is electrically connected with the external terminals 16 and the supply terminal 31.

Next, a method for positioning a head slider 27 relative to the optical waveguide 19 of the suspension board with circuit 1 using the positioning marks 50 is described with reference to FIGS. 7 and 8.

In FIG. 7, the head slider 27 is arranged above the optical waveguide 19 and the pedestal 40 in spaced relation thereto, and a camera 43 is also arranged above the front end portion of the optical waveguide 19 so as to sandwich the head slider 27.

As shown in FIG. 8, the head slider 27 integrally includes a slider body 29, a slider-side optical waveguide 34 provided in the front end portion thereof, a near-field light generation portion 35, and a magnetic head 44.

The slider-side optical waveguide 34 is provided in order to enter light applied from the end face 21 of the path 49 of the optical waveguide 19 into the near-field light generation portion 35. The slider-side optical waveguide 34 is formed along the thickness direction of the suspension board with circuit 1, its lower end (an entrance) being opposed in spaced relation to the end face 21 of the path 49 of the optical waveguide 19 in the thickness direction, and its upper end (an exit) being connected with the near-field light generation portion 35 explained below.

The near-field light generation portion 35 is provided in order to produce a near-field light from the light (transmission light) emitted from the upper end of the slider-side optical waveguide 34, and apply the near-field light to a surface of the hard disk 26 to heat a minute region on the surface of the hard disk 26. The near-field light generation portion 35 is provided in the slider body 29 so as to be fixed to the upper end of the slider-side optical waveguide 34. Such near-field light generation portion 35 is made of a metal scatterer, an opening, etc. and known near-field light generators described in, for example, Japanese Unexamined Patent Publication No. 2007-280572, Japanese Unexamined Patent Publication No. 2007-052918, Japanese Unexamined Patent Publication No. 2007-207349, and Japanese Unexamined Patent Publication No. 2008-130106 are used.

The magnetic head 44 is mounted in a minute region on the surface of the hard disk 26 heated by the near-field light generation portion 35 in order to record information, and is provided near the near-field light generation portion 35.

A plurality (two pieces) of slider marks 51 arranged in spaced relation to each other in the widthwise direction are provided in the front end portion of the slider body 29 so as to correspond to the positioning marks 50.

Each of the slider marks 51 is formed in the form of an opening extending through the slider body 29 in the thickness direction, and is regarded as a reference for positioning of the head slider 27 and the optical waveguide 19. Specifically, when the slider marks 51 and the positioning marks 50 are aligned, the near-field light generation portion 35 of the head slider 27 and the slider-side optical waveguide 34 are opposed to the end face 21 of the path 49 of the front end portion of the optical waveguide 19 in the thickness direction.

In this method, in the above-mentioned arrangement, the slider marks 51 and the positioning marks 50 are aligned using the camera 43. Specifically, the head slider 27 is positioned relative to the optical waveguide 19 so that the positioning marks 50 are visually identified through the slider marks 51 from the camera 43.

After the positioning, the head slider 27 is fixed to the upper surface of the pedestal 40 of the suspension board with circuit 1 through adhesives, etc. as required.

Thereafter, the terminal of the magnetic head 44 is electrically connected with the head terminals 17.

The hard disk drive mounted with the suspension board with circuit 1 mounted with the head slider 27 adopts an optical assist system.

In the hard disk drive, as shown in FIG. 8, for example, the hard disk 26 travels relatively to the near-field light generation portion 35 and to the magnetic head 44.

A light emitted from the light emitting device 20 enters into the rear end portion of the path 49 of the optical waveguide 19, the light is then transmitted toward the front side in the path 49, its optical path is deflected upward on the end face 21 of the front end portion of the path 49, and the light finally emits upward from the end face 21 of the front end portion of the path 49. Thereafter, the light emitted from the path 49 enters into the lower end portion of the slider-side optical waveguide 34 and then transmitted upward in the slider-side optical waveguide 34. The light thus transmitted is emitted from the upper end portion of the slider-side optical waveguide 34 and then enters into the near-field light generation portion 35. Thereafter, the application of the light produces a near-field light in the near-field light generation portion 35, and the near-field light is applied toward the surface of the hard disk 26.

The application of the near-field light from the near-field light generation portion 35 causes the surface of the hard disk 26 to be heated. In such state, a magnetic field is applied from the magnetic head 44, whereby information is recorded on the surface of the hard disk 26. Specifically, the heating caused by the application of the near-field light from the near-field light generation portion 35 reduces a coercive force of the surface of the hard disk 26, and information is recorded on such surface of the hard disk 26 at high density by applying a small magnetic field from the magnetic head 44.

According to the suspension board with circuit 1, the use of the positioning marks 50 enables the near-field light generation portion 35 and the slider-side optical waveguide 34 to be accurately positioned relative to the optical waveguide 19. This allows a light transmitted through the optical waveguide 19 to be reliably applied to the near-field light generation portion 35 through the slider-side optical waveguide 34, so that the hard disk 26 can sufficiently be heated.

As a result, the information can be recorded on the hard disk 26 at high density, thereby allowing to reliably perform the optical assist system.

The optical waveguide 19 of the suspension board with circuit 1 has a strip-loaded structure. Specifically, in the core layer 23, when a portion facing the underside of the over clad layer 24 is applied with light, the path 49 (see FIG. 2) capable of transmitting the light is formed along the over clad layer 24. Since the over clad layer 24 is exposed to air and has a higher refractive index than air (in excess of 1), it can be easily visually identified from above.

Therefore, the relative position of the path 49 to the positioning marks 50 can be easily recognized. As a result, the near-field light generation portion 35 and the slider-side optical waveguide 34 can be accurately positioned relative to the path 49.

Further, in the optical waveguide 19 of the above-mentioned suspension board with circuit 1, since the over clad layer 24 is formed in the above-mentioned width range, the light transmitted in the optical waveguide 19 is reliably and efficiently applied as a single-mode light to the near-field light generation portion 35, allowing the hard disk 26 to be heated reliably and efficiently.

In the above-mentioned description on FIG. 4, the positioning mark 50 is formed in a generally rectangular shape in plane view. However, the shape thereof is not particularly limited, and the positioning mark 50 can be formed in an appropriate shape such as a triangular shape in plane view or a generally circular shape in plane view, though not shown.

In the above-mentioned description, the slider mark 51 is provided in the slider body 29. However, for example, it can be provided in the slider-side optical waveguide 34 and/or the near-field light generation portion 35, though not shown.

Figure 9:
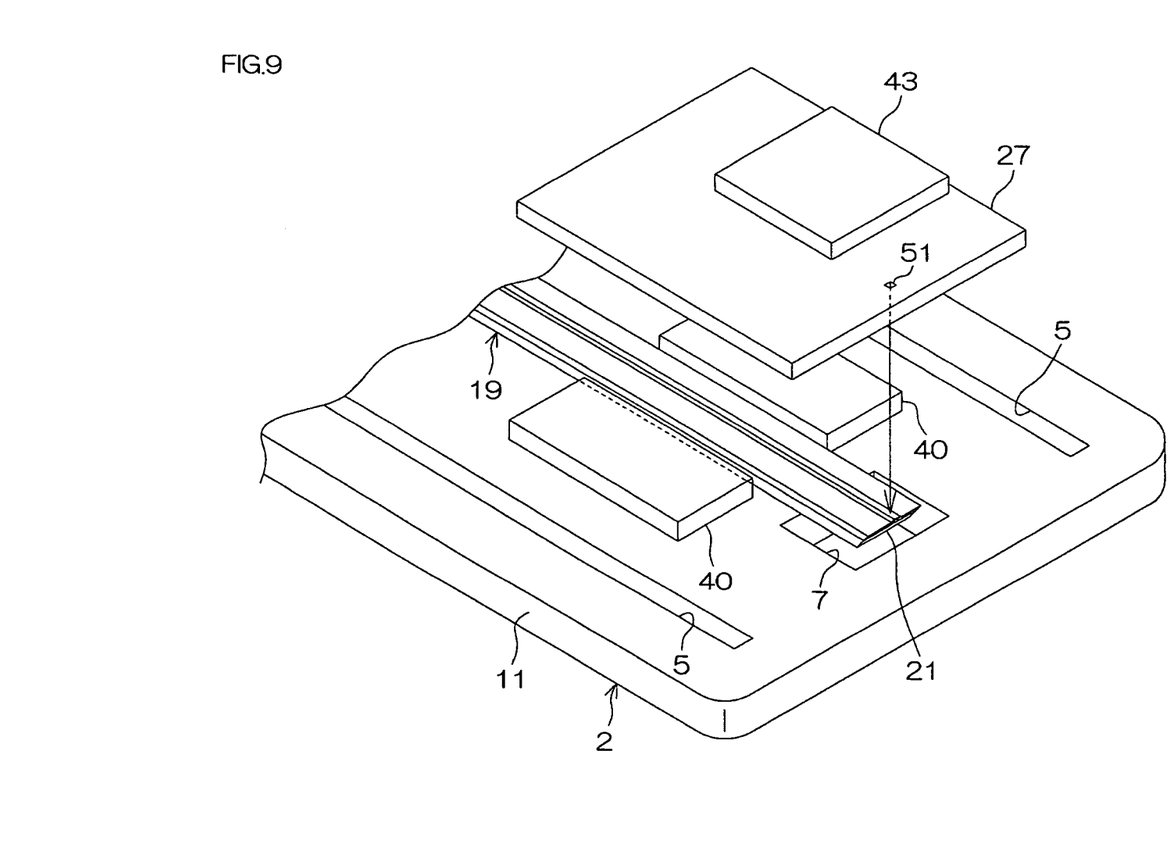
FIG. 9 is a perspective view illustrating positioning of the head slider relative to the optical waveguide of another embodiment (an embodiment in which a positioning mark is not formed) of the suspension board with circuit according to the present invention.

FIG. 9 is an enlarged perspective view illustrating positioning of the head slider relative to the optical waveguide of another embodiment (an embodiment in which a positioning mark is not formed) of the suspension board with circuit according to the present invention. In FIG. 9, the same reference numerals are provided for members corresponding to each of those described above, and their detailed description is omitted.

In the above-mentioned description, the positioning portion of the present invention is set as the positioning mark 50 arranged in spaced relation to the over clad layer 24 and such portion is used for positioning relative to the optical waveguide 19. However, for example, as shown in FIG. 9, the front end portion itself of the over clad layer 24 can be used as the positioning portion for positioning the near-field light generation portion 35 and the slider-side optical waveguide 34 relative to the optical waveguide 19 without using the positioning mark 50.

In FIG. 9, one slider mark 51 is provided so as to correspond to the front end portion of the over clad layer 24.

The over clad layer 24 has the above-mentioned refractive index, specifically, has a higher refractive index than air and is formed so as to be included in the core layer 23 in plane view. Therefore, the over clad layer 24 can be reliably visually identified from above.

For this reason, even when the front end portion of the optical waveguide 19 and the slider mark 51 are aligned, the front end portion of the over clad layer 24 can be visually identified through the slider mark 51 with the camera 43. This allows reliable positioning of the head slider 27 relative to the optical waveguide 19.

Preferably, the positioning portion is set as the positioning mark 50 and is used for positioning the head slider 27 relative to the optical waveguide 19.

Since the positioning marks 50 are spaced apart from the over clad layer 24, the use of the positioning marks 50 enables easy recognition of a deviation of the relative position of the path 49 to the positioning mark 50 in plane view.

Therefore, the near-field light generation portion 35 and the slider-side optical waveguide 34 can be further accurately positioned relative to the path 49.

In the above-mentioned formation of the optical waveguide 19 shown in FIGS. 5(b) to 5(d), 6(e), and FIG. 6(f), each of the under clad layer 22, the core layer 23, and the over clad layer 24 is formed by exposing the photosensitive coating to light via the photomask 38 and developing the coating. However, for example, the under clad layer 22, the core layer 23, and the over clad layer 24 may be formed by placing a mold, pouring a varnish into the mold, drying the varnish to form the coating of the above-mentioned shape, and then curing the coating. The positioning mark 50 is also formed in the same manner as above with the formation of the over clad layer 24.

The under clad layer 22, the core layer 23, and the over clad layer 24 are preferably formed by exposing the photosensitive coating to light via the photomask 38 and developing the coating.

In particular, when the over clad layer 24 and the positioning marks 50 are formed by exposing the photosensitive coating 39 to light via the photomask 38 and developing the coating, the over clad layer 24 and the positioning marks 50 can be simultaneously formed by one exposure to light via one sheet of photomask 38 and can be accurately relatively positioned.

Therefore, the near-field light generation portion 35 and the slider-side optical waveguide 34 can be even further accurately positioned relative to the path 49.

In the above-mentioned description, the near-field light generation portion 35 is provided in the head slider 27. However, for example, the near-field light generation portion 35 may be provided directly on the rear surface of the suspension board with circuit 1 though not shown, and a light transmitted in the optical waveguide 19 is directly applied to the near-field light generation portion 35 without passing through the slider-side optical waveguide 34.

On the other hand, when the near-field light generation portion 35 is provided in the head slider 27, the optical assist system can be reliably performed because the head slider 27 mounts both the near-field light generation portion 35 and the magnetic head 44.

In the above-mentioned description, the optical waveguide 19 is directly provided on the upper surface of the metal supporting board 11. However, though not shown, for example, it may be provided on the upper surface of the metal supporting board 11 via an adhesive layer.

Specifically, the optical waveguide 19 is prepared separately from the circuit board 2.

To prepare the optical waveguide 19, the under clad layer 22, the core layer 23, and the over clad layer 24 are sequentially laminated on a release sheet such as a polyethylene terephthalate (PET) sheet which is not shown. Thereafter, the optical waveguide 19 is removed from the release sheet.

Then, the optical waveguide 19 is adhesively bonded onto the metal supporting board 11 via an adhesive layer.

In this manner, the optical waveguide 19 can be simply provided on the metal supporting board 11 by laminating the optical waveguide 19 on the upper surface of the metal supporting board 11 via an adhesive layer. Therefore, the production cost can be reduced.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit comprising:
   a circuit board comprising a metal supporting board formed so as to extend in a lengthwise direction, an insulating layer formed on the metal supporting board, and a conductive layer formed on the insulating layer; and
   an optical waveguide provided in the circuit board, and a light emitting device that is a light source for allowing light to be applied to the optical waveguide,
      the optical waveguide being provided with a positioning portion for positioning the optical waveguide and a near-field light generation portion for generating a near-field light by a light applied from the optical waveguide,
   wherein the circuit board includes a wire portion arranged on one side in the lengthwise direction and a gimbal portion arranged on the other side in the lengthwise direction of the wire portion,
   the optical waveguide is arranged over the wire portion and the gimbal portion,
   the light emitting device is arranged in the wire portion, and
   the positioning portion is arranged in the optical waveguide of the gimbal portion.

2. The suspension board with circuit according to claim 1, wherein the optical waveguide comprises:
   an under clad layer,
   a core layer formed on the under clad layer, and
   an over clad layer formed on the core layer and contained in the core layer when projected in a thickness direction of the core layer.

3. The suspension board with circuit according to claim 2, wherein the positioning portion is arranged in spaced relation to the over clad layer.

4. The suspension board with circuit according to claim 2, wherein the over clad layer extends in a lengthwise direction and has a width in a direction perpendicular to the lengthwise direction of 10 µm or less.

5. The suspension board with circuit according to claim 1, wherein the near-field light generation portion is provided in the head slider where a magnetic head is mounted.

6. A method of producing a suspension board with circuit comprising:
   a circuit board comprising a metal supporting board formed so as to extend in a lengthwise direction, an insulating layer formed on the metal supporting board, and a conductive layer formed on the insulating layer; and
   an optical waveguide provided in the circuit board, and a light emitting device that is a light source for allowing light to be applied to the optical waveguide,
      the optical waveguide being provided with a positioning portion for positioning the optical waveguide and a near-field light generation portion for generating a near-field light by a light applied from the optical waveguide,
   wherein the circuit board includes a wire portion arranged on one side in the lengthwise direction and a gimbal portion arranged on the other side in the lengthwise direction of the wire portion,
   the optical waveguide is arranged over the wire portion and the gimbal portion,
   the light emitting device is arranged in the wire portion,
   the positioning portion is arranged in the optical waveguide of the gimbal portion, and
   the optical waveguide and the near-field light generation portion are positioned by using the positioning portion.

7. A method of producing a suspension board with circuit comprising the steps of:
   preparing a circuit board comprising a metal supporting board, an insulating layer formed on the metal supporting board, and a conductive layer formed on the insulating layer; and
   providing an optical waveguide in the circuit board, the optical waveguide comprising an under clad layer, a core layer formed on the under clad layer, an over clad layer formed on the core layer and contained in the core layer when projected in the thickness direction of the core layer, and a positioning portion arranged in spaced relation to the over clad layer, for positioning relative to a near-field light generation portion for generating a near-field light by an applied light, wherein the step of providing the optical waveguide in the circuit board comprises the steps of forming a photosensitive coating on the core layer, and simultaneously forming the over clad layer and the positioning portion by exposing the coating to light via one sheet of photomask and then developing the coating.

8. The suspension board with circuit according to claim 1, wherein the positioning portion comprises at least one mark.

9. The suspension board with circuit according to claim 8, wherein the at least one mark comprises a single positioning mark.

10. The suspension board with circuit according to claim 9, wherein the optical waveguide comprises:
    an under clad layer,
    a core layer formed on the under clad layer, and
    an over clad layer formed on the core layer and contained in the core layer when projected in a thickness direction of the core layer.

11. The suspension board with circuit according to claim 10, wherein the at least one mark comprises a slider mark provided so as to correspond to a front end portion of the over clad layer.

12. The suspension board with circuit according to claim 8, wherein the at least one mark comprises a plurality of positioning marks.

13. The suspension board with circuit according to claim 12, wherein the optical waveguide comprises:
- an under clad layer,
- a core layer formed on the under clad layer, and
- an over clad layer formed on the core layer and contained in the core layer when projected in a thickness direction of the core layer.

14. The suspension board with circuit according to claim 13, wherein the at least one mark comprises a plurality of positioning marks arranged on the optical waveguide in spaced relation to the over clad layer.

15. The suspension board with circuit according to claim 14, wherein the at least one mark comprises a plurality of slider marks arranged in a slider body so as to correspond to the plurality of positioning marks.

* * * * *